United States Patent
Kanda

(10) Patent No.: US 7,737,048 B2
(45) Date of Patent: Jun. 15, 2010

(54) METHOD FOR CONTROLLING THICKNESS DISTRIBUTION OF A FILM

(75) Inventor: Takayuki Kanda, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 306 days.

(21) Appl. No.: 11/514,934

(22) Filed: Sep. 5, 2006

(65) Prior Publication Data

US 2007/0054423 A1 Mar. 8, 2007

(30) Foreign Application Priority Data

Sep. 6, 2005 (JP) .............................. 2005-257361

(51) Int. Cl.
*H01L 21/31* (2006.01)
(52) U.S. Cl. .................. 438/763; 438/769; 438/770; 257/E21.271; 257/E21.278; 257/E21.282
(58) Field of Classification Search ................ 438/763, 438/769, 770
See application file for complete search history.

(56) References Cited

U.S. PATENT DOCUMENTS 6,495,805 B2 * 12/2002 Sakamoto et al. ........... 219/483

2002/0001788 A1 * 1/2002 Sakamoto et al. ............. 432/24
2003/0100194 A1 5/2003 Nakamura

FOREIGN PATENT DOCUMENTS

| JP | 2003-86713 | 3/2003 |
| JP | 2003-163212 | 6/2003 |
| JP | 2002-373984 | 12/2005 |

OTHER PUBLICATIONS

Japanese Patent Office issued a Japanese Office Action dated Jan. 14, 2010, Application No. 2005-257361.

* cited by examiner

*Primary Examiner*—Hsien-ming Lee
(74) *Attorney, Agent, or Firm*—Young & Thompson

(57) ABSTRACT

A method for forming an oxide film includes a first in-situ steam generation (ISSG) process using a 1%-$H_2$ concentration in the ambient gas and a subsequent second ISSG process using a 5%-$H_2$ concentration in the ambient gas, wherein the second ISSG process compensates an in-plane thickness distribution of the film formed by the first ISSG process. The time length for the first and second ISSG steps is determined based on a desired film thickness, a time length dependency of a film formed by the second ISSG process, and the oxidation rate of the first and second ISSG processes.

14 Claims, 6 Drawing Sheets

METHOD FOR CONTROLLING THICKNESS DISTRIBUTION OF A FILM

BACKGROUND OF THE INVENTION (a) Field of the Invention

The present invention relates to a method for controlling the thickness distribution of a thin film and, more particularly, to a method suitable for controlling the thickness distribution of an oxide film formed in an in-situ steam generation (ISSG) technique.

(b) Description of the Related Art

The process for manufacturing semiconductor devices generally uses the step of forming a silicon oxide film on a wafer. An ISSG technique is known to form the silicon oxide film, as described in Patent Publications JP-2003-086716A and JP-2002-373984A. The ISSG technique has an advantage over the conventional dry-oxidation technique etc. in that the resultant silicon oxide film has a uniform thickness.

It is known that the silicon oxide film (referred to as merely oxide film hereinafter) formed by the ISSG technique has an in-plane thickness distribution depending on the combinational process condition (process condition) used therein. For example, the in-plane thickness distribution varies depending on the $H_2$ concentration and ambient pressure in the ISSG process. More specifically, a higher $H_2$ concentration provides an oxide film having a larger thickness in the peripheral area than in the central area of the wafer, whereas a lower $H_2$ concentration provides an oxide film having a smaller thickness in the peripheral area than in the central area. A higher ambient pressure provides an oxide film having a larger thickness in the central area than in the peripheral area of the wafer, whereas a lower ambient pressure provides an oxide film having a smaller thickness in the central area than in the peripheral area.

FIG. 9 shows an example of the ambient pressure dependency of the thickness of the oxide film formed by the ISSG process. In this example, the ambient pressure in the ISSG process is varied, with the process temperature being fixed at a specific temperature and the $H_2$ concentration in the ambient gas being fixed at 1%. As understood from FIG. 9, the thickness distribution of the oxide film has a significant dependency on the ambient pressure in the ISSG process.

It may be expected that since the film thickness has the ambient pressure dependency and the $H_2$ concentration dependency of the thickness distribution, an optimum combination of the $H_2$ concentration and the ambient pressure provides a smaller range of variation in the in-plane film thickness. However, it is known that control of the $H_2$ concentration varies the thickness of the oxide film in a larger amount to render the film thickness being out of control.

Thus, in the conventional ISSG technique, the ambient pressure is varied stepwise from 7 Torr to 10 Torr, for example, to form oxide films, with the $H_2$ concentration being fixed for a specific film thickness, and the thickness distribution of the resultant oxide film is measured for each of the ambient pressures, as shown in FIG. 9. Thereafter, a process condition or ambient pressure, which provided an oxide film having an optimum thickness distribution is selected. By employing the selected process condition or ambient pressure, the ISSG process is conducted for forming oxide films in the product semiconductor devices.

In the conventional technique as described above, since the ambient pressure dependency of the in-plane thickness distribution of the oxide film must be investigated for a variety of combinational process conditions each including a processing temperature, a $H_2$ concentration etc., a large amount of fundamental data must be obtained for this investigation. In particular, if maintenance of the oxidation system, such as replacement of the lamp or cleaning of the chamber which affects the thickness distribution, is performed, the fundamental data must be again obtained. Thus, the technique for improving the in-plane thickness distribution to obtain an excellent in-plane thickness uniformity of the oxide film has been required in the ISSG process, and it is an essential issue in the ISSG process to meet this requirement.

SUMMARY OF THE INVENTION

In view of the above, it is an object of the present invention to provide a technique for determining the process conditions in forming a thin film having a superior in-plane thickness uniformity of the thin film without investigating a variety of process conditions in a process for forming the thin film.

The present invention provides, in a first aspect thereof, a method for designing a thickness distribution of an oxide film formed by using a combination of a first oxidation process and a subsequent second oxidation process having different process conditions achieving different in-plane thickness distributions, the method including the steps of: determining a time length of the second oxidation process compensating a range of in-plane thickness variation of an oxide film to be formed by the first oxidation process; calculating a thickness of a base oxide film expected before start of the second oxidation process based on a desired film thickness, the time length determined by the determining step, and an oxidation rate in the second oxidation process; and obtaining a time length of the first oxidation process needed for forming the base oxide film having the calculated thickness calculated by the calculating step based on the calculated thickness, and an oxidation rate in the first oxidation process.

The present invention also provides, in a second aspect thereof, a method for manufacturing a semiconductor device having an oxide film, including the steps of: determining a time length of a second oxidation process compensating a range of thickness variation of an oxide film to be formed by a first oxidation process, the first and second oxidation processes having different process conditions achieving different in-plane thickness distributions, the second oxidation process succeeding to the first oxidation process; calculating a thickness of a base oxide film expected before start of the second oxidation process based on a desired film thickness, the time length determined by the determining step, and an oxidation rate in the second oxidation process; obtaining a time length of the first oxidation process needed for forming the base oxide film having the calculated thickness calculated by the calculating step based on the calculated thickness, and an oxidation rate in the first oxidation process; and performing the first oxidation process for the time length obtained for the first oxidation process, and performing the second oxidation process for the time length determined for the second time length to form the oxide film having a compensated in-plane thickness distribution.

The present invention also provides, in a third aspect thereof, a method for designing a thickness distribution of a thin film formed by using a combination of a first process and a subsequent second process having different process conditions achieving different in-plane thickness distributions, the method including the steps of: determining a time length of the second process compensating a range of in-plane thickness variation of a thin film to be formed by the first process; calculating a thickness of a base oxide film expected before start of the second process based on a desired film thickness, the time length determined by the determining step, and an oxidation rate in the second process; and obtaining a time length of the first process needed for forming the base oxide film having the calculated thickness calculated by the calculating step based on the calculated thickness, and a filming rate in the first process.

In accordance with the methods of the present invention, the time length for the first and second (oxidation) processes can be calculated by a desk calculation to obviate performing experimental processes, and to obtain an improved in-plane thickness uniformity of the resultant oxide film or thin film.

The above and other objects, features and advantages of the present invention will be more apparent from the following description, referring to the accompanying drawings.

PREFERRED EMBODIMENT OF THE INVENTION

Before describing an embodiment of the present invention, the principle of the present invention will be described for a better understanding of the present invention. A method for forming an oxide film according to an embodiment of the present invention uses a combination of two known process conditions having different oxidation rates, for allowing a desk investigation of the thickness uniformity of the oxide film formed by, for example, the ISSG process. Hereinafter, an oxide film formed by the ISSG process will be referred to sometimes as ISSG film.

The present invention uses the general knowledge that a combination of a first oxidation process conducted for a first time length and a second oxidation process conducted for a second time length provides a specific film thickness as will be described hereinafter, both the oxidation processes using different process conditions and being conducted in succession. The specific film thickness is equal to the film thickness that is formed by the second oxidation process conducted for the sum of a third time length and the second time length, where given third time length is such that the third time length of the second oxidation process will provide a film thickness that is formed by the first oxidation process conducted for the first time length.

The present invention also uses the fact that the two different ISSG processings conducted under the same process condition of 1050 degrees C. and 7.3 Torr, for example, provide opposite thickness distributions on the wafer if the ISSG processings are conducted at the conditions of a 1%-$H_2$ concentration and a 5%-$H_2$ concentration. The term "opposite thickness distributions" as used herein means, for example, that the film thickness formed by one of the ISSG conditions is larger in the central area of the wafer than in the peripheral area thereof whereas the film thickness formed by the other of the ISSG processings is smaller in the central area than in the peripheral area.

By using the above knowledge and fact, the first time length for the first oxidation process and the second time length for the second oxidation process can be systematically calculated based on the film thickness to be formed, the time length dependency of the thickness distribution in the second oxidation process, and the oxidation rates at the $H_2$ concentrations, such as 1%-$H_2$ concentration and 5%-$H_2$ concentration. Since the improvement of the in-plane thickness uniformity can be achieved by the combination of the known first and second process conditions based on a desk calculation, the time length for configuring the process conditions is expected to be drastically reduced. It should be noted here that the present invention premises that the oxidation rate does not substantially depend on the ambient pressure, as is considered in the conventional ISSG technique.

Figure 8:
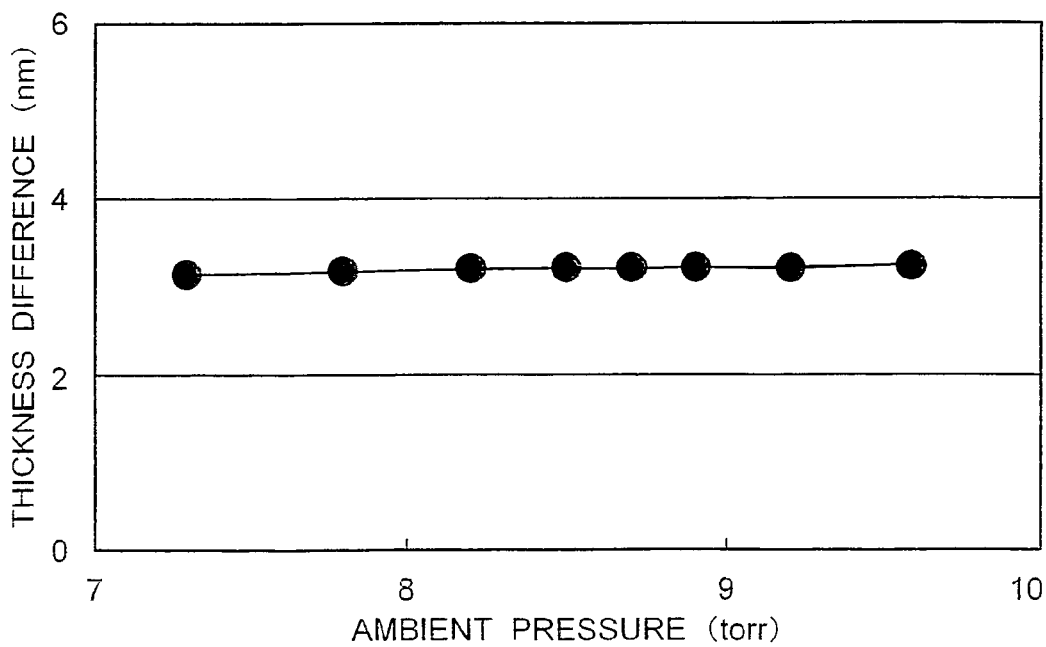
FIG. 8 is a graph showing substantially no ambient pressure dependency of the thickness of the oxide film formed by the first oxidation process.

FIG. 8 shows the ambient pressure dependency of the thickness of the ISSG film formed under the condition of 1050 degrees C. and a 1%-$H_2$ concentration for a time length of 15 seconds. As will be understood from FIG. 8, there is substantially no significant ambient pressure dependency of the film thickness, and thus the time length for both the oxidation processings using a 1%-$H_2$ concentration and a 5%-$H_2$ concentration is determined based on this premise.

It is known that the ISSG process using the process condition of 7.3 Torr and 1050 degrees C. provides a thickness distribution wherein the film thickness is larger in the central area if a 1%-$H_2$ concentration is used, and also provides an opposite thickness distribution wherein the film thickness is larger in the peripheral area if a 5%-$H_2$ concentration is used. Thus, if the first ISSG process uses a 1%-$H_2$ concentration at a pressure of 7.3 Torr and the subsequent second ISSG process uses a 5%-$H_2$ concentration at the same pressure, or if only the order of the processings are reversed from the recited order, the thickness distributions obtained in the respective first and second ISSG processes are expected to compensate each other, to thereby provide an excellent in-plane thickness uniformity for the ISSG film.

The process of the present invention uses a combination of process conditions having different oxidation rates. Thus, the oxidation rate should be calculated in order for achieving a desired film thickness. For this purpose, the principle that the thermal oxide film obtained by the two-step oxidation process has the specific thickness, as described above in the general knowledge, can be used. It should be noted that the first oxidation process and the second oxidation process both using the ISSG technique can be successively performed as a sequence of processing, and thus it is unnecessary to consider an increase of the film thickness during an interval between the first oxidation process and the second oxidation process.

A design process of an embodiment of the present invention is used for combining two oxidation processes using different process conditions which provide opposite thickness distributions and have known oxidation rates. The advantage of the design process of the present invention over the conventional technique is that the process conditions can be determined or fixed by a desk calculation.

Figure 1:
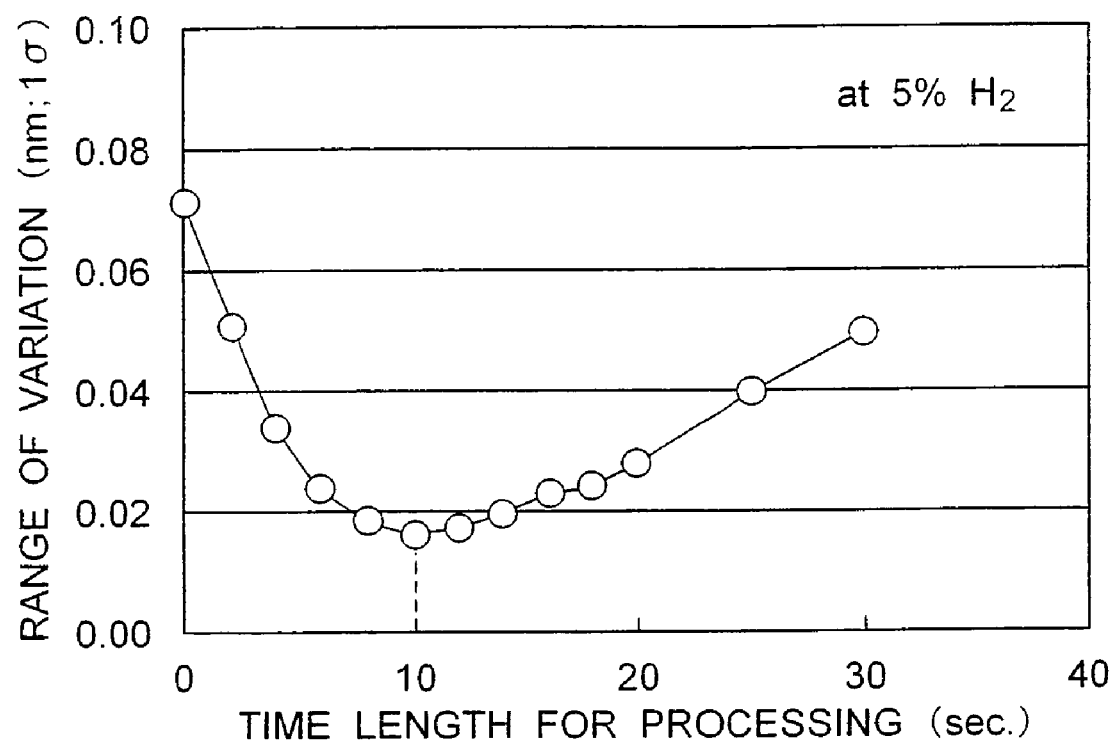
FIG. 1 is a graph showing the relationship between the time length for the second oxidation process succeeding to a first oxidation process and the range of variation of the film thickness.

Now, the present invention is more specifically described with reference to accompanying drawings based on an embodiment of the present invention. FIG. 1 exemplifies the relationship between the time length of the second oxidation (ISSG) process and the range of in-plane variation of the resultant film. In FIG. 1, the abscissa represents the time length (seconds) of the second ISSG process conducted at a 5%-$H_2$ concentration subsequent to the first ISSG process conducted at a 1%-$H_2$ concentration for 15 seconds. The ordinate represents the range of variation, i.e., standard deviation σ(nm), relating to the in-plane thickness distribution of the resultant ISSG film.

Figure 9:
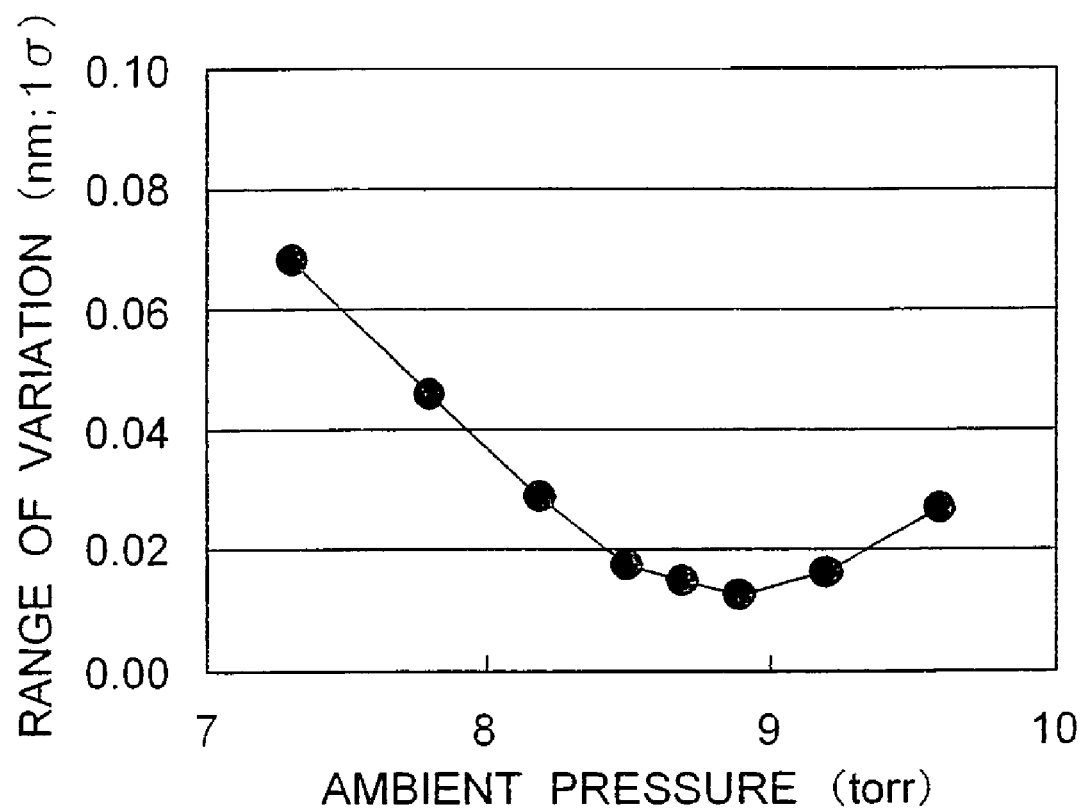
FIG. 9 is a graph showing the ambient pressure dependency of the thickness of the oxide film formed by a typical ISSG process.

The ISSG film formed at an ambient pressure of 7.3 Torr has a thickness larger in the central area of the wafer if the $H_2$ concentration is 1%, whereas the ISSG film has a thickness larger in the peripheral area if the $H_2$ concentration is 5%. Thus, by performing a first ISSG process under the condition of 7.3 Torr, 1050 degrees C. and a 1%-$H_2$ concentration for 15 seconds and a subsequent second ISSG process under the condition of 7.3 Torr, 1050 degrees C. and a 5%-$H_2$ concentration, the second ISSG process is considered to improve the in-plane uniformity of the ISSG film depending on the time length of the second ISSG process. FIG. 1 shows the results of the improvement wherein the second ISSG process improves the in-plane uniformity depending on the processing time length without employment of a variety of ambient pressures as used in FIG. 9. FIG. 1 shows that the optimum in-plane thickness uniformity is achieved by a time length of 10 seconds for the second ISSG process using a 5%-$H_2$ concentration.

Figure 2A:
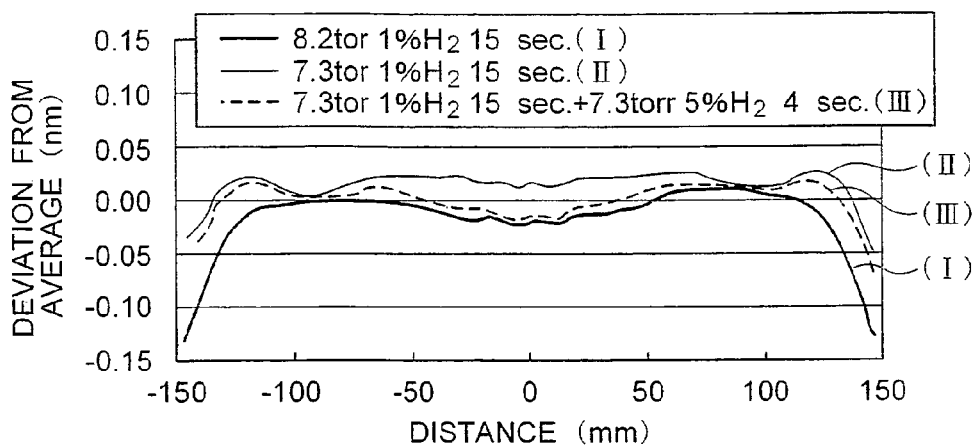
FIGS. 2A, 2B and 2C are graphs each showing the relationship between the distance (ordinate) from the center of the wafer and a deviation of the film thickness from the average thickness in the case of first oxidation, second oxidation and combination of first oxidation and second oxidation, upon using a variety of process conditions.
Figure 2B:
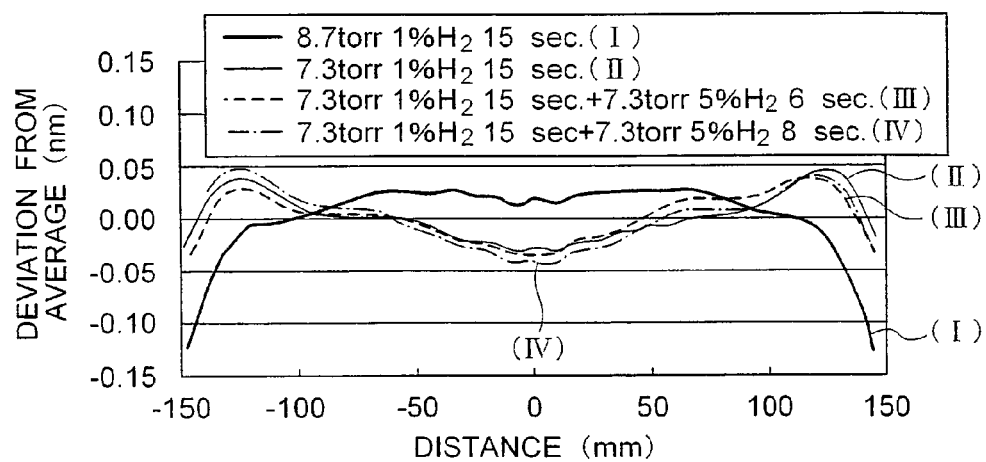
Figure 2C:
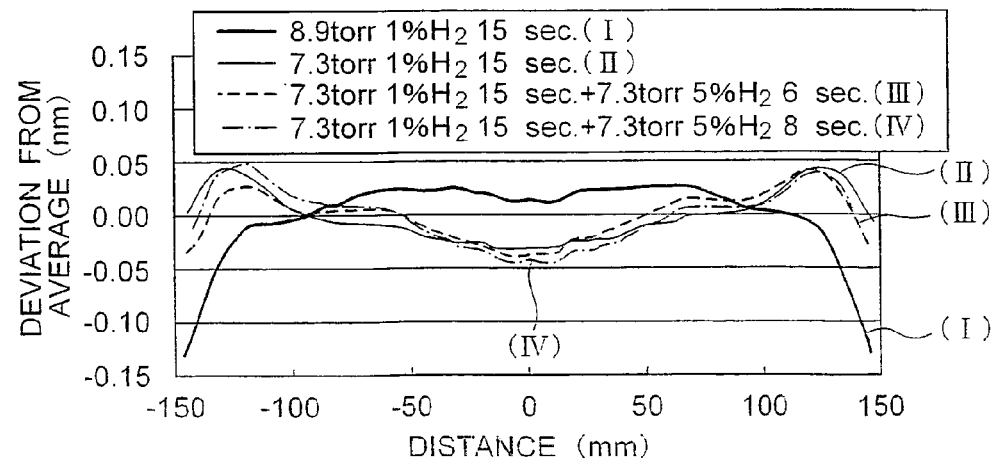

FIGS. 2A to 2C each show results of experiments performed for obtaining the relationship between the distance from the center, or ordinate, of the wafer and a deviation of the thickness from the average thickness in the case of the first oxidation, second oxidation and a combination of the first oxidation and the second oxidation, while using different process conditions. FIG. 2A shows the in-plane thickness variation for the case of conducting: (I) an ISSG process at 8.2 Torr and 1%-$H_2$ concentration for 15 seconds; (II) an ISSG process at 7.3 Torr and 1%-$H_2$ concentration for 15 seconds; and (III) a first ISSG process at 7.3 Torr and 1%-$H_2$ concentration for 15 seconds and a subsequent second ISSG process at 7.3 Torr and 5%-$H_2$ concentration for 4 seconds.

FIG. 2B shows the in-plane thickness variation for the case of conducting: (I) an ISSG process at 8.7 Torr and 1%-$H_2$ concentration for 15 seconds; (II) an ISSG process at 7.3 Torr and 1%-$H_2$ concentration for 15 seconds; (III) a first ISSG process at 7.3 Torr and 1%-$H_2$ concentration for 15 seconds and a second ISSG process at 7.3 Torr and 5%-$H_2$ concentration for 6 seconds; and first ISSG process at 7.3 Torr and 1%-$H_2$ concentration for 15 seconds and a subsequent second ISSG process at 7.3 Torr and 5% -$H_2$ concentration for 8 seconds.

FIG. 2C shows the in-plane thickness variation for the case of conducting: (I) an ISSG process at 8.9 Torr and 1%-$H_2$ concentration for 15 seconds; (II) an ISSG process at 7.3 Torr and 1%-$H_2$ concentration for 15 seconds; (III) a first ISSG process at 7.3 Torr and 1%-$H_2$ concentration for 15 seconds and a subsequent second ISSG process at 7.3 Torr and 5%-$H_2$ concentration for 6 seconds; and (IV) a first ISSG process at 7.3 Torr and 1%-$H_2$ concentration for 15 seconds and a subsequent second ISSG process at 7.3 Torr and a 5%-$H_2$ concentration for 8 seconds.

FIGS. 2A to 2C reveal that the first ISSG process at a 1%-$H_2$ concentration and a subsequent second ISSG process at a 5%-$H_2$ concentration, which are conducted under the same ambient pressure, provided results equivalent to the results obtained by changing the ambient pressure in the conventional technique. Thus, in the ISSG process used in the present invention, for achieving a uniform in-plane thickness distribution, the $H_2$ concentration is changed, with the ambient pressure being fixed, to obtain results similar to the results obtained by changing both the $H_2$ concentration and the ambient pressure in the conventional technique.

For achieving a desired thickness of the ISSG film in the process of the present embodiment using a combination of the first oxidation process and the second oxidation process, the practical process conditions in these processes are calculated in the manner as described hereinafter.

Figure 3:
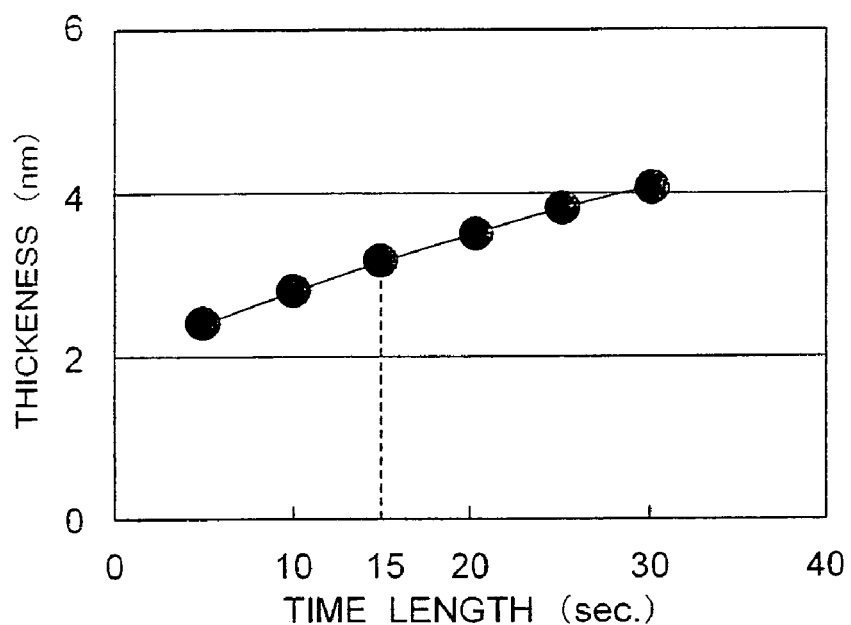
FIG. 3 is a graph showing the oxidation rate in the first oxidation process.

FIG. 3 shows the oxidation rate in the first ISSG process conducted at a 1%-$H_2$ concentration and a temperature of 1050 degrees C. As understood from FIG. 3, an about 3-nm-thick ISSG film is obtained at a time length of 15 seconds, for example. Thus, the second ISSG process at 1050 degrees C. and 5%-$H_2$ concentration performed subsequent to the first ISSG process performed at 1050 degrees C. and 1%-$H_2$ concentration is equivalent to an ISSG process at 1050 degrees C. and 5% -$H_2$ concentration performed on a base ISSG film having a thickness of 3 nm.

Figure 4:
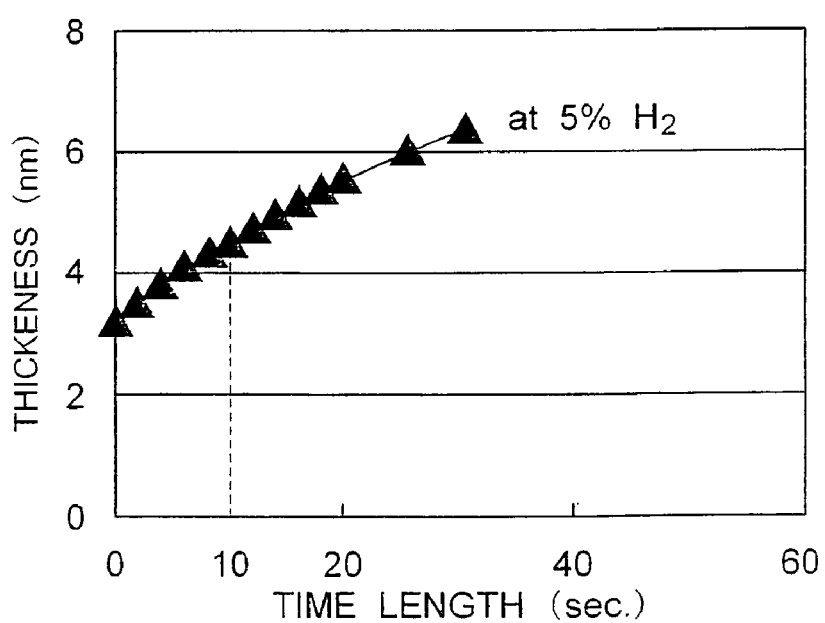
FIG. 4 is a graph showing the oxidation rate in the second oxidation process succeeding to the first oxidation process.

FIG. 4 shows the relationship between the thickness of the ISSG film and the time length of the second ISSG process conducted at a 5%-$H_2$ concentration and a temperature of 1050 degrees C. subsequent to the first ISSG process as described above with reference to FIG. 3. The second ISSG process achieves an optimum in-plane uniformity for the case of a 5%-$H_2$ concentration, a temperature of 1050 degrees C. and a time length of 10 seconds, as described with reference to FIG. 1. This time length corresponds to about 4 nm in FIG. 4. That is, the second ISSG process conducted at 1050 degrees C. and a 5%-$H_2$ concentration for 10 seconds subsequent to the first ISSG process increases the thickness of the ISSG film from the initial 3 nm to 4 nm.

In order for applying the present invention to a practical process to obtain a desired thickness of the thermal oxide film, it is necessary to determine the increase of the film thickness during the second oxidation process before the process condition of the first oxidation process is determined.

For systematically calculating the increase of the film thickness, the present invention uses the general knowledge, as described before, that a combination of the first oxidation process conducted for a first time length and the second oxidation process conducted for a second time length provides a specific film thickness, both the oxidation processes using different process conditions and being conducted in succession, and that the specific film thickness is equal to the film thickness that is formed by the second oxidation process conducted for the sum of a third time length and the second time length, where given third time length is such that the third time length of the second oxidation process will provide a film thickness that is formed by the first oxidation process conducted for the first time length.

Figure 5:
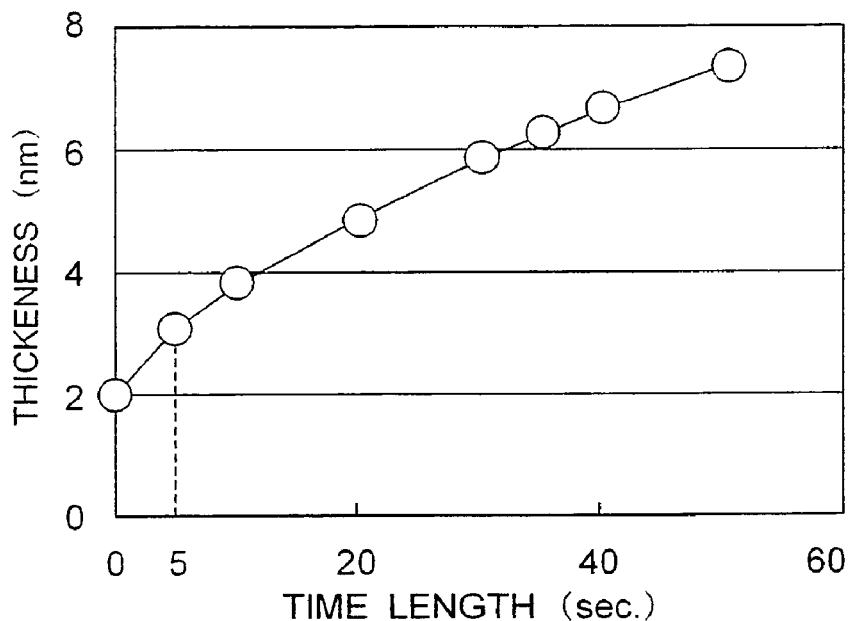
FIG. 5 is a graph showing the oxidation rate in the second oxidation process without a preceding first oxidation process.
Figure 6:
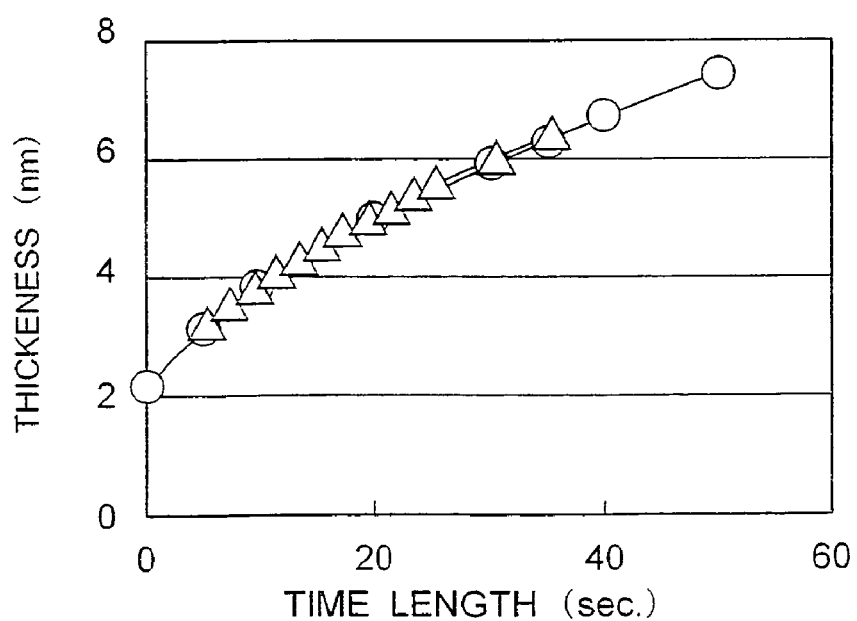
FIG. 6 is a graph comparing the oxidation rate of FIG. 4 against that of FIG. 5.

FIG. 5 shows the oxidation rate in the second oxidation process conducted at a 5%-$H_2$ concentration and a temperature of 1050 degrees C., in the case where a preceding first oxidation process is not performed. The thickness of 3 nm formed by the first oxidation process corresponds to a time length of 5 seconds in FIG. 5. Thus, a graph obtained by shifting the graph of FIG. 4 by the 5 seconds toward right will coincide with a portion of the graph of FIG. 5 depicted at right side of the 5 seconds. The result of the coincidence is shown in FIG. 6, wherein triangle dots correspond to the graph of FIG. 4 and circular dots correspond to the graph of FIG. 5. FIG. 6 shows the expected result of the coincidence between those graphs. Thus, in a theoretical sense, the desired film thickness, oxidation rates in the first and second oxidation processes and time length of the second oxidation process will suffice the condition for determining the time length of the first oxidation process and second oxidation process by a desk calculation.

Figure 7:
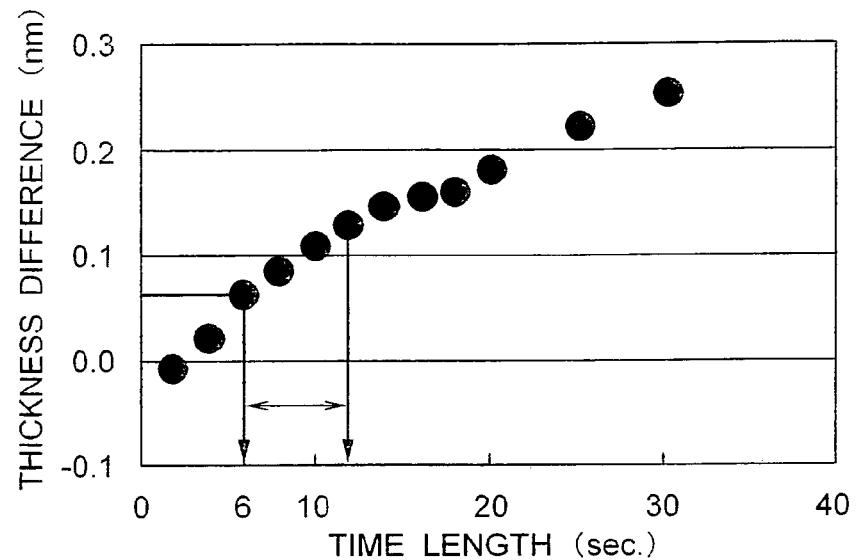
FIG. 7 is a graph showing the relationship between the time length and the thickness distribution in the second oxidation process succeeding to the first oxidation process.

The time length of the second oxidation process is calculated in the manner as described hereinafter. From the graph II in FIGS. 2A to 2C, the first oxidation process conducted at a 1%-$H_2$ concentration and a temperature of 1050 degrees C. for 15 seconds provides an ISSG film having a thickness difference of about 0.05 nm between the center of the wafer and a location 130 nm apart from the center, with the thickness being larger in the peripheral area. FIG. 7 is a graph showing the time length dependency of the thickness difference between the center of the wafer and the location 130 nm apart from the center in the second ISSG process at 1050 degrees C. and a 5%-$H_2$ concentration. The graph of FIG. 7 shows that a thickness difference of 0.05 nm is obtained by a time length of about 6 seconds, although the thickness difference is such that the thickness is larger in the central area. That is, a time length of 6 seconds for the second oxidation process cancels the thickness difference incurred in the first oxidation process. Here, it is noted that oxidation on the oxide film provides an oxidation rate slightly lower than the oxidation rate of oxidation on the silicon surface. Thus, in a practical technique, the 6 seconds obtained from the graph should be preferably increased to some extent, e.g., increased up to 8 to 10 seconds. The time length of the 8 to 10 seconds is substantially equivalent to the optimum time length shown in FIG. 1.

Summing up the above description, the process according to the present embodiment includes the following steps:

(1) determining the time length of the second oxidation process based on the time length dependency of the range of variation in the thickness of the oxide film formed by the first oxidation process and second oxidation process:

(2) calculating the thickness of the base oxide film expected before the start of the second oxidation process based on the desired thickness of the oxide film and the oxidation rate in the second oxidation rate; and (3) obtaining the time length of the first oxidation process needed for forming a film thickness equal to the thickness of the base oxide film before the start of the second oxidation process based on the oxidation rate in the first oxidation process.

The calculation of the time length of the first oxidation process and the second oxidation process can be performed by a desk calculation.

In the above embodiment, a combination of the first oxidation process and the second oxidation process using different $H_2$ concentrations is used for improvement of an in-plane thickness uniformity. However, the first and second oxidation processes may have different conditions in other terms of process condition such as temperature and ambient pressure, if the desired film thickness limits the use of such a high $H_2$ concentration.

The present invention may be preferably applied to a process for forming a sacrificial oxide film. The sacrificial oxide film has been formed heretofore by an oxidation process using a high $H_2$ concentration and a high processing temperature in order for forming a reliable oxide film. The control of the thickness for the sacrificial oxide film is difficult to achieve due to the request of a smaller thickness thereof in recent years. Thus, the process for forming the sacrificial oxide film includes the first oxidation process using a high temperature and a low $H_2$ concentration and the second oxidation process using a high temperature and a high $H_2$ concentration for a short time length, in order for forming a reliable sacrificial oxide film.

The present invention is not limited to an oxidation process using an ISSG process, and may be applied to a general filming process for forming a film by using, for example, a deposition technique so long as the general process incurs an ununiform in-plane thickness distribution of the resultant film.

Since the above embodiments are described only for examples, the present invention is not limited to the above embodiments and various modifications or alterations can be easily made therefrom by those skilled in the art without departing from the scope of the present invention.

What is claimed is:

1. A method for designing a thickness distribution of an oxide film formed by using a combination of a first oxidation process forming a first portion of the oxide film and a subsequent second oxidation process for forming a second portion of the oxide film which is disposed on the first portion of the oxide film, wherein the first oxidation process and the second oxidation process have different process conditions thereby achieving different in-plane thickness distributions, said method comprising the steps of:

determining a time length of the second oxidation process to compensate for a variation of in-plane thickness of the first portion of the oxide film to be formed by the first oxidation process;

calculating a thickness of the first portion of the oxide film based on a predetermined final film thickness of the oxide film, the time length for forming the second portion of the oxide film determined by said determining step, and an oxidation rate of the second oxidation process; and obtaining a time length of the first oxidation process needed for forming the first portion of the oxide film having the thickness calculated by said calculating step based on an oxidation rate of the first oxidation process.

2. The method according to claim 1, wherein said determining step determines the time length of the second oxidation process based on a time length dependency of an in-plane thickness distribution of the second portion of the oxide film formed by the second oxidation process.

3. The method according to claim 1, wherein the first oxidation process and the second oxidation process use different $H_2$ concentrations.

4. The method according to claim 1, wherein the first oxidation process and the second oxidation process use the same ambient pressure.

5. The method according to claim 1, further comprising the steps of forming said first portion of the oxide film and said second portion of the oxide film based on time lengths calculated for said first and second oxidation processes.

6. The method according to claim 1, wherein the oxide film is a single-layer oxide film.

7. A method for manufacturing a semiconductor device having an oxide film, wherein the oxide film has a first portion and a second portion disposed on said first portion, the method comprising the steps of:

determining a second time length of a second oxidation process that forms the second portion of the oxide film, wherein the second portion of the oxide film compensates for a variation of film thickness of the first portion of the oxide film to be formed by a first oxidation process, said first and second oxidation processes having different process conditions achieving different in-plane thickness distributions, said second oxidation process succeeding to said first oxidation process;

calculating a thickness of the first portion of the oxide film based on a predetermined final film thickness of the oxide film, the second time length determined by said determining step, and an oxidation rate of said second oxidation process;

obtaining a first time length of said first oxidation process needed for forming the first portion of the oxide film based on the calculated thickness of the first portion of the oxide film, and an oxidation rate of said first oxidation process;

performing said first oxidation process for the first time length; and performing said second oxidation process for the second time length.

8. The method according to claim 7, wherein said determining step determines the second time length of said second oxidation process based on a time length dependency of an in-plane thickness distribution of the second portion of the oxide film formed by said second oxidation process.

9. The method according to claim 7, wherein said first oxidation process and said second oxidation process use different $H_2$ concentrations.

10. The method according to claim 7, wherein said first oxidation process and said second oxidation process use the same ambient pressure.

11. The method according to claim 7, wherein the oxide film is a single-layer oxide film.

12. A method for designing a thickness distribution of an oxide film formed by using a combination of a first process and a subsequent second process having different process conditions achieving different in-plane thickness distributions, said method comprising the steps of:

determining a time length of the second process based on a time length dependency of an in-plane thickness distribution that forms an upper portion of the oxide film, wherein the time length of the second process compensates for the in-plane thickness variation of a lower portion of the oxide film to be formed by the first process;

determining a film thickness of the upper portion of the oxide film based on the determined time length of the second process and an oxidation rate of the second process;

calculating a film thickness of the lower portion of the oxide film based on the determined film thickness of the upper portion of the oxide film and a predetermined final film thickness of the oxide film; and determining a time length of the first process to form the lower portion of the oxide film based on the calculated film thickness of the lower portion of the oxide film and an oxidation rate of the first process.

13. The method according to claim 12, further comprising the steps of forming said lower portion of the oxide film and said upper portion of the oxide film based on the time lengths determined for said first and second processes.

14. The method according to claim 12, wherein the oxide film is a single-layer oxide thin film.

* * * * *